United States Patent
Hijzen et al.

(10) Patent No.: US 6,441,454 B2
(45) Date of Patent: Aug. 27, 2002

(54) TRENCHED SCHOTTKY RECTIFIERS

(75) Inventors: Erwin A. Hijzen, Breda; Raymond J. E. Hueting, Helmond, both of (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/773,412

(22) Filed: Feb. 1, 2001

(30) Foreign Application Priority Data

Feb. 2, 2000 (GB) .............................................. 0002235

(51) Int. Cl.$^7$ ............................................ H01L 27/095
(52) U.S. Cl. ...................... 257/483; 257/339; 257/355; 257/475; 257/484; 257/493
(58) Field of Search ................. 257/471, 475, 257/483, 484, 488, 492, 493, 339, 355

(56) References Cited

U.S. PATENT DOCUMENTS

| | | | |
|---|---|---|---|
| 4,646,115 A | 2/1987 | Shannon et al. | 357/15 |
| 5,262,669 A | * 11/1993 | Wakatabe et al. | 257/483 |
| 5,365,102 A | * 11/1994 | Mehrotra et al. | 257/475 |
| 5,612,567 A | 3/1997 | Baliga | 257/475 |
| 5,679,966 A | * 10/1997 | Baliga et al. | 257/139 |
| 5,949,124 A | 9/1999 | Hadizad et al. | 257/496 |
| 5,998,833 A | 12/1999 | Baliga | 257/329 |
| 6,309,929 B1 | * 10/2001 | Hsu et al. | 438/270 |

FOREIGN PATENT DOCUMENTS

WO 0074146 A1 12/2000

* cited by examiner

*Primary Examiner*—Eddie Lee
*Assistant Examiner*—N. Drew Richards
(74) *Attorney, Agent, or Firm*—Steven R. Biren

(57) ABSTRACT

Inner trenches (11) of a trenched Schottky rectifier (1a; 1b; 1c; 1d) bound a plurality of rectifier areas (43a) where the Schottky electrode (3) forms a Schottky barrier 43 with a drift region (4). A perimeter trench (18) extends around the outer perimeter of the plurality of rectifier areas (43a). These trenches (11, 18) accommodate respective inner field-electrodes (31) and a perimeter field-electrode (38) that are connected to the Schottky electrode (3). The inner field-electrodes (11) are capacitively coupled to the drift region (4) via dielectric material (21) that lines the inner trenches (11). The perimeter field-electrode (38) is capacitively coupled across dielectric material (28) on the inside wall (18a) of the perimeter trench 18, without acting on any outside wall (18b). Furthermore, the inner and perimeter trenches (11, 18) are closely spaced and the intermediate areas (4a, 4b) of the drift region (4) are lowly doped. The spacing is so close and the doping is so low that the depletion layer (40) formed in the drift region (4), from the Schottky barrier (43) and from the field-relief regions (31,21; 38,28) in the blocking state of the rectifier, may deplete the whole of the intermediate areas (4a, 4b) between the trenches (11, 18) at a blocking voltage just below the breakdown voltage. This arrangement reduces the risk of premature breakdown that can occur at high field points in the depletion layer (40), especially at the perimeter of the array of rectifier areas (43a).

13 Claims, 3 Drawing Sheets

TRENCHED SCHOTTKY RECTIFIERS

BACKGROUND OF THE INVENTION

This invention relates to Schottky rectifiers, and more particularly to measures for increasing the breakdown voltage of such rectifiers. The invention also relates to methods of manufacturing such rectifiers.

Schottky rectifiers are known comprising a semiconductor body having a body portion of one conductivity type between first and second main electrodes, of which the first main electrode forms a Schottky barrier with the body portion at a plurality of rectifier areas of a first surface of the body portion. Various embodiments of such rectifiers are disclosed in U.S. Pat. No. 4,646,115 (our reference PH33047), the whole contents of which are hereby incorporated herein as reference material. In one type of embodiment, a pattern of trenches extends into the body portion from the first surface. The pattern comprises inner trenches that bound each rectifier area and a perimeter trench that has an inside wall extending around the outer perimeter of the plurality of rectifier areas. The trenches accommodate a field-electrode that is connected to the first main electrode. The field-electrode is capacitively coupled to the body portion via dielectric material that lines the trenches so as to provide field-relief regions in the body portion.

The inner trenches are sufficiently closely spaced and the intermediate areas of the body portion are sufficiently lowly doped that the depletion layer formed in the body portion (from the Schottky barrier and from the field-relief regions in the blocking state of the rectifier) depletes the intermediate areas of the body portion between the trenches at a voltage less than the breakdown voltage. In this manner, the trenched inner field-relief regions significantly improve the voltage blocking characteristic of the device.

Premature breakdown of this type of Schottky rectifier can occur at high field points in the depletion layer, especially at the perimeter of the active area. To reduce or avoid such premature breakdown, U.S. Pat. No. 4,646,115 discloses providing this type of rectifier with a perimeter field-relief region comprising a field electrode on dielectric material in a perimeter trench. U.S. Pat. No. 4,646,115 describes forming the perimeter field-relief region simultaneously with the inner field-relief regions so as to reduce the total number of processing steps for the manufacture of the device. In the embodiments shown in U.S. Pat. No. 4,646,115, the perimeter trench is of the same depth and width as the inner trenches. It is lined with the same thickness of the same dielectric material. The perimeter field electrode is present on this dielectric material on inside and outside walls of the perimeter trench (as well the bottom of the trench) and so is capacitively coupled to the body portion across both the inside wall and the outside wall.

SUMMARY OF THE INVENTION

It is an aim of the present invention to improve the trenched field-relief regions of Schottky rectifiers, especially at the perimeter of the device, and to facilitate the manufacture of these improved rectifiers.

According to the present invention, there is provided a Schottky rectifier with trenched inner and perimeter field-relief regions. The perimeter field-electrode in its perimeter trench is present on its dielectric material on the inside wall of the perimeter trench so as to be capacitively coupled across said inside wall without acting on any outside wall. Furthermore, the inner and perimeter trenches are sufficiently closely spaced and the intermediate areas of the body portion are sufficiently lowly doped, that the depletion layer formed in the body portion in the blocking state of the rectifier depletes the intermediate areas of the body portion between the trenches at a voltage less than the breakdown voltage. Advantageously the perimeter trench extends deeper in the body than the inner trenches to improve its inwardly directed field relief function.

Thus, in a rectifier in accordance with the invention, the inwardly-acting field electrode of the perimeter trench is so constructed and arranged with respect to the inner trenches as to reduce the high field points by depleting the body portion between the trenches, without any significant outward extension. This depletion arrangement uses the perimeter and inner trenched field-electrodes in a particular form of the so-called "RESURF" technique.

Particular advantageous forms of this construction and arrangement can be achieved without requiring extra processing steps in manufacture. In particular, the perimeter trench can be made deeper than the other trenches by making it wider. Due to local loading effects during etching of the inner trenches, this increased width can be used to produce automatically a deeper perimeter trench. A thick dielectric layer is advantageous in the deep perimeter trench and can be provided in various ways.

The invention may be advantageously used in conjunction with various known Schottky rectifier options. Thus, for example, a graded doping can be advantageous in the body portion in some situations, as described in U.S. Pat. No. 5,612,567 and in pending U.S. patent application Ser. No. 09/167,298 which is referenced in columns 11 & 12 of U.S. Pat. No. 5,998,833. The whole contents of U.S. Pat. No. 5,612,567, U.S. Pat. No. 5,998,833 and U.S. application Ser. No. 09/167,298 are hereby incorporated herein as reference material. As described in U.S. Pat. No. 5,998,833, U.S. application Ser. No. 09/167,298 also describes the use of breakdown shielding regions between the perimeter trench and the inner trenches.

Some of the particularly advantageous technical features and some of the options available with the invention are set out in the appended claims. The invention provides several advantageous novel combinations of features, many of which are illustrated in the embodiments now to be described with reference to the drawings. Specific examples are the depth and width of the perimeter trench and its relationship to the perimeter of the semiconductor body, and adjustments in the dopant concentration of the body portion in relation to an increase of dielectric thickness in a lower part of the trench.

BRIEF DESCRIPTION OF THE DRAWING

Particular embodiments of the present invention are now described, by way of example, with reference to the accompanying diagrammatic drawings, in which.

Figure 1:
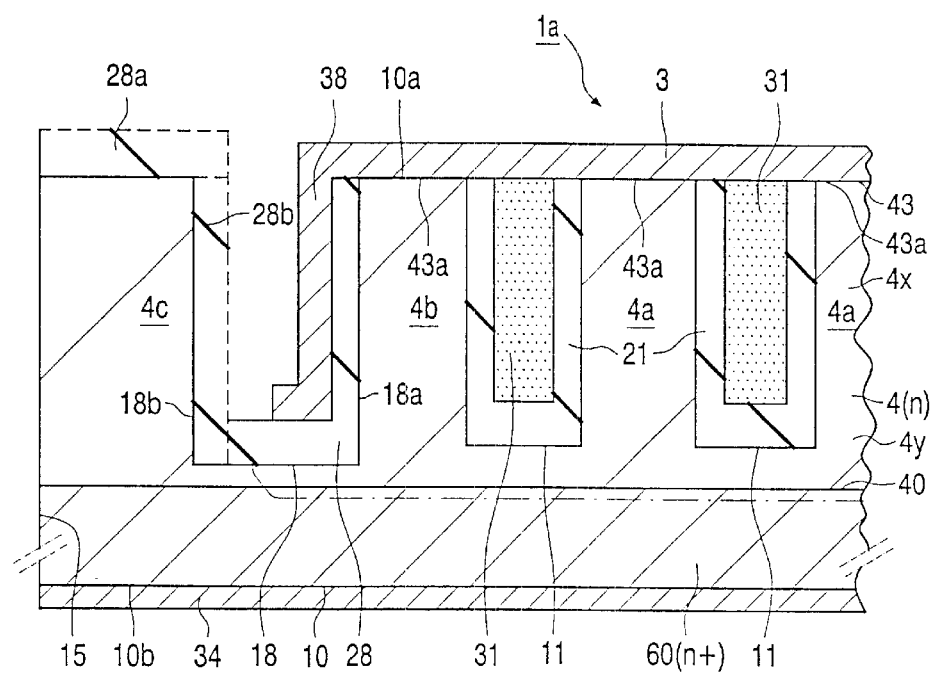
FIG. 1 is a cross-sectional view of part of a trenched Schottky rectifier in accordance with the invention.

It should be noted that all the Figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DESCRIPTION OF THE PREFERRED EMBODIMENTS

The Schottky rectifiers 1*a*, 1*b*, 1*c* and 1*d* of FIGS. 1 to 4 each comprise a semiconductor body 10 having a body portion 4 of one conductivity type (n-type in this example) between first and second main electrodes 3 and 34. The first main electrode 3 forms a Schottky barrier 43 with the body portion at a plurality of rectifier areas 43*a* of a first surface 10*a* of the body portion 4.

A pattern of trenches 11, 18 extends into the body portion 4 from the surface 10*a*. This pattern comprises inner trenches 11 that bound each rectifier area 43*a* and a perimeter trench 18 that has an inside wall 18*a* extending around the outer perimeter of the plurality of rectifier areas 43*a*. The trenches 11 and 18 accommodate respective inner field-electrodes 31 and a perimeter field-electrode 38 that are connected to the first main electrode 3 of the rectifier 1*a*, 1*b*, 1*c*, 1*d*. These field-electrodes 31 and 38 are capacitively coupled to the body portion 4 via dielectric material 21 and 28 that lines the respective trenches 11 and 18 so as to provide field-relief regions in the body portion 4.

In each of the Schottky rectifiers 1*a*, 1*b*, 1*c* and 1*d* of FIGS. 1 to 4, the field-electrode 38 in the perimeter trench 18 is present on the dielectric material 28 on the inside wall 18*a* of the perimeter trench 18. It is capacitively coupled across this inside wall without acting on any outside wall. The perimeter field-electrode 38 is not present on any dielectric material lining any outside wall 18*b* of the perimeter trench 18 and is not capacitively coupled to the body portion 4 across any such outside wall 18*b*. Indeed the perimeter trench 18 has no outside wall in the rectifiers 1*b*, 1*c* and 1*d* of FIGS. 2 to 4.

Furthermore, in each of the Schottky rectifiers 1*a*, 1*b*, 1*c* and 1*d* of FIGS. 1 to 4, the intermediate areas 4*a* and 4*b* of the body portion 4 are lowly doped and the inner and perimeter trenches 11 and 18 are closely spaced. The doping of the areas 4*a* and 4*b* is sufficiently low that the electrode 3 can form the desired Schottky barrier 43 with the body portion 4. Furthermore, the spacing is so close and the doping is so low that the depletion layer 40 formed in the body portion 4 (from the Schottky barrier 43 and from the field-relief regions 31,21 and 38,28) in the blocking state of the rectifier depletes the whole of the intermediate areas 4*a* and 4*b* of the body portion 4 between the trenches 11 and 18 at a voltage less than the breakdown voltage. The depletion may occur at or near the maximum blocking voltage of the device, which is near, i.e. just below, the breakdown voltage.

Thus, in the rectifiers in accordance with the invention, the inwardly-acting field electrode 38 of the perimeter trench 18 is so constructed and arranged with respect to the inner trenches 11 as to reduce high field points by depleting the body portion 4 between the trenches 18 and 11, without any significant outward extension of the depletion layer 40. Apart from the construction and arrangement of this inwardly-acting field electrode 38 and the close spacing of the trenches 18 and 11, the rectifiers 1*a*, 1*b*, 1*c* and 1*d* of FIGS. 1 to 4 can be known type. Thus, the rectifiers 1*a*, 1*b*, 1*c* and 1*d* of FIGS. 1 to 4 may be manufactured with similar geometries, materials, processes, and doping concentrations to those described in U.S. Pat. No. 4,646,115, U.S. Pat. No. 5,612,567, U.S. Pat. No. 5,998,833 and U.S. application Ser. No. 09/167,298. Advantageous novel differences in accordance with the invention may also be adopted as disclosed hereinafter.

Most usually, a Schottky rectifier in accordance with the invention will be a discrete vertical device structure such as is illustrated in FIGS. 1 to 4, in which the second main electrode 34 is at the bottom surface 10*b* of the body 10, where it forms an ohmic contact with a highly doped (n+) substrate 60. Typically, the device body 10 is of monocrystalline, silicon. The doping concentration (n+) of the substrate 60 may be, for example, $10^{18}$ to $10^{21}$ phosphorus or arsenic atoms $cm^{-3}$. Aluminium or Ti—Ni—Ag are two examples of commonly-used electrode materials suitable for the ohmic-substrate electrode 34. On this substrate 60, an epitaxial layer of higher resistivity is present to provide the body portion 4 with which the Schottky barrier 43 is formed. The epitaxial layer and substrate are of the same conductivity type, usually n-type. The choice of material for the Schottky electrode 3 depends on the desired barrier height, and specific examples of suitable commonly-used materials are platinum silicide or titanium. The choice of doping concentration and thickness for the drift region 4 depends on the desired blocking voltage of the rectifier, but is usually in the range of, for example, $10^{15}$ to $10^{17}$ phosphorus or arsenic atoms $cm^{-3}$ with a thickness of about 2 μm (micrometres) or more. The drift region 4 may have a uniform doping concentration (n), for example of the order of $10^{15}$ dopant atoms $cm^{-3}$. However, as described below, the drift region 4 may have a doping concentration (n) that increases with depth in order to reduce the on-resistance of the device.

Figure 2:
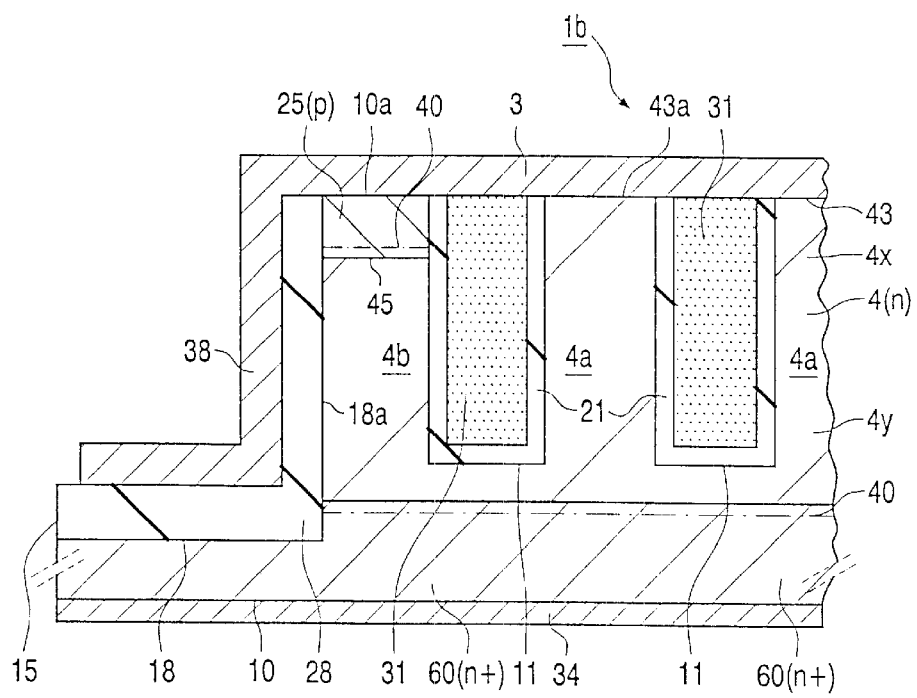
FIGS. 2, 3 and 4 are similar cross-sectional views of part of three other trenched Schottky rectifiers also in accordance with the invention.
Figure 3:
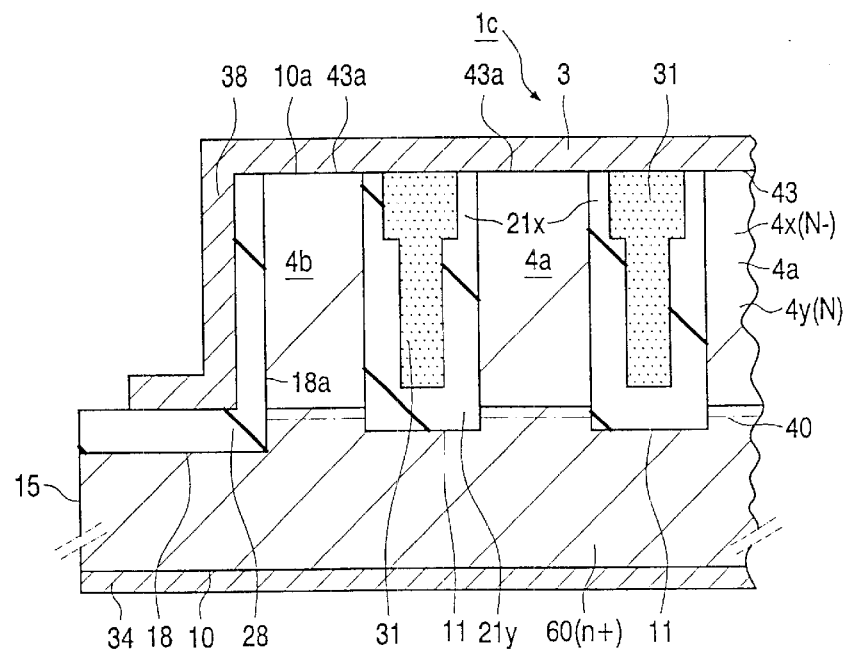
Figure 4:
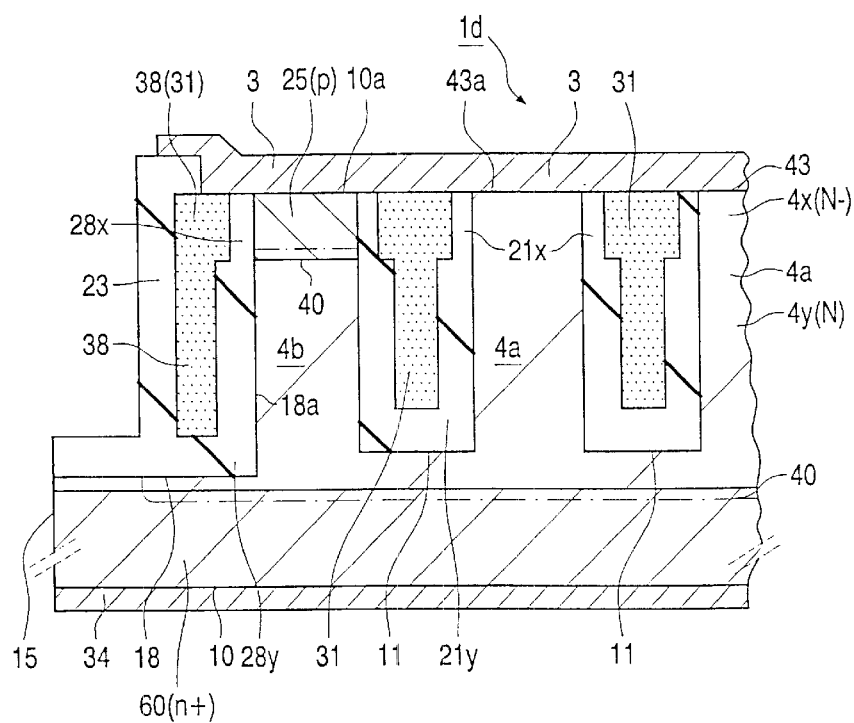

The inner field-electrodes 31 can be formed conveniently of conductive polycrystalline silicon on an insulating layer 21 of silicon dioxide. The perimeter trench dielectric 28 may also be of silicon dioxide, and may even have the same composition and thickness(es) as the layer 21 of the inner trenches 11. The perimeter field electrode 38 can be formed conveniently of the same material as the Schottky electrode 3 or the inner field-electrodes 31. By way of example, FIGS. 1 to 3 show the perimeter field-electrode 38 formed by a simple extension of the Schottky electrode 3. FIG. 4 shows the perimeter field-electrode 38 formed by extending the inner electrode network 31 outward, around the perimeter wall 18*a*. A similar extension of the inner electrode network 31 may also be adopted to form the perimeter field plate 38 in a modification of the devices of FIGS. 1 to 3.

Usually the inner trenches 11 are sufficiently deep to extend across most of the thickness of the drift region 4. The trenches 11 may even extend slightly into the substrate 60, a specific example being shown in FIG. 3. The depth of the perimeter trench 18 may be about the same as that of the inner trenches 11, or it may be deeper. The close spacing of the inner trenches 11 and perimeter trench 18 may be such as to provide a width of, for example, 0.5 μm to 1 μm for the intermediate parts 4*a* and 4*b* of the drift region 4. Thus, if the width of the inner trench 11 is 0.5 μm to 1 μm, then the trenched rectifier has a cell pitch of 1 μm to 2 μm, i.e. a spacing of 1 μm to 2 μm between centres of the neighbouring trenches 11.

In a blocking state of the rectifier, a depletion layer 40 is formed in the drift region 4 from the Schottky barrier areas 43*a* with the drift region 4 and from the field-relief regions 31,21 and 38,28. The extent of this depletion layer 40 is indicated in chain dot outline (—■—) in FIGS. 1 to 4. Thus, the depletion layer 40 of FIGS. 1 to 4 extends across the whole of the drift region 4 between the trenches 11,18 and also slightly into the higher-doped substrate 60. This depletion layer 40 depletes the whole of the intermediate areas 4*a* of the drain drift region 4 between neighbouring trenches 11 at the blocking voltage. This is caused by a field plate effect of the trenched field-electrode 31 of the neighbouring cells in the drift region 4.

At the edge of the rectifier, a field plate effect is achieved by the provision of the field electrode 38 around the array perimeter in a manner in accordance with the invention. This electrode 38 is capacitively coupled across the dielectric material 28 in the perimeter trench 18, but only on its inside wall 18a without effectively extending as a field plate on any outside wall 18b of the perimeter trench. Thus, the field electrode 38 acts inwardly towards the rectifier array, without significantly spreading the depletion layer 40 outwardly towards the perimeter 15 of the semiconductor body 10. The resulting depletion of the intermediate area (4b in FIGS. 1 and 2 and 4a in FIG. 3) between the trenches 11,18 reduces the electric field around the perimeter of the outermost active cell 1, while avoiding any breakdown towards the perimeter 15 of the body 10.

Many modifications and variations are possible within the scope of the present invention. Several such modifications are illustrated in the separate embodiments 1a, 1b, 1c, and 1d of FIGS. 1 to 4. It will be evident that alternative features which are shown in one embodiment may be adopted in another of the embodiments.

In the rectifiers of FIGS. 1 to 4, the perimeter trench 18 extends deeper in the body 10 than the inner trenches 11 and is wider than the inner trenches 11. Since the electric field at the bottom of this deep trench 18 is larger than at the bottom of a shallower trench, the dielectric 28 that lines at least the lower part of this deep trench 18 is preferably quite thick. Thus, it can be advantageous for at least this area of the dielectric 28 to be thicker than the dielectric 21 that lines at least an upper part of the inner trenches 11.

In the rectifier 1a of FIG. 1, the deeper and wider trench 18 is spaced from the perimeter 15 of the semiconductor body 10 by a peripheral area 4c of the drift region 4. Thus, this perimeter trench 18 has an outside wall 18b, as illustrated in FIG. 1. Although FIG. 1 shows (in broken outline) a possible dielectric layer 28a on the surface 10a of the peripheral area 4c, this dielectric 28a can be omitted. Similarly, even the dielectric layer 28b on the outside wall 18b of the perimeter trench 18 could be omitted. The omission of these dielectric layers 28a and 28b is possible because of the peripheral isolating effect of avoiding any field plate action in an outward direction from the trench 18 towards the perimeter 15 of the body 10. This peripheral isolation can still be achieved if the gap shown in the perimeter trench 18 in FIG. 1 were to be filled with an insulating material of sufficiently low dielectric constant and large thickness that there is no significant capacitive coupling between the field plate 38 and the peripheral portion 4c at the outside wall 18b.

However, it is not necessary for the perimeter trench 18 (that extends around the array of rectifier areas) to be spaced from the perimeter 15 of the body 10. FIGS. 2 to 4 illustrate specific embodiments 1b, 1c and 1d having a simpler and more compact layout geometry. In the rectifiers 1b, 1c and 1d, the perimeter trench 18 is so wide as to extend to the perimeter 15 of the body 10. Thus, these devices of FIGS. 2 to 4 have no outside wall 18b to their perimeter trench 18.

The perimeter trench 18 of FIGS. 2 and 3 is so deep as to extend through the thickness of the drift region 4 to the higher conductivity substrate 60. The perimeter trench 18 in the devices of FIGS. 1 and 4 may likewise extend into the substrate 60, or it may be shallower, for example even of the same depth as the inner trenches 11. FIGS. 1 and 4 illustrate an intermediate situation where the trench 18 is deeper than the inner trenches 11 but shallower than the interface of the drift region 4 with the substrate 60. This intermediate situation may also be adopted in a modification of the devices of FIGS. 2 and 3.

FIG. 1 illustrates a rectifier in which the dielectric 28 in the perimeter trench 28 is of the same composition and thickness as the dielectric 21 in the inner trenches 11 and so may be formed in the same processing steps. FIG. 2 illustrates a difference in the dielectrics 21 and 28. The dielectric 28 in the perimeter trench 28 of FIG. 2 is thicker than the dielectric 21 in the inner trenches 11. Thus, the dielectrics 28 and 21 may be separately optimised in composition and thickness for their separate field-effect actions at the perimeter of the device and within the rectifier array. Each dielectric layer 21 or 28 may be of substantially uniform thickness, as illustrated in FIGS. 1 and 2. However, the thickness of the dielectric 21 and/or 28 may vary with depth so as to tailor the field effect action with depth.

FIGS. 3 and 4 illustrate rectifiers in which the dielectric material 21 that lines the inner trenches 11 is of increased thickness in the substrate-adjacent portion of the drift region as compared with its thickness in the surface-adjacent portion. Thus, the dielectric portion 21x lining the upper portion of the trench 11 is thinner than the dielectric portion 21y lining the lower portion. Such a variation in dielectric thickness can be particularly beneficial when the drift region 4 has distinct surface-adjacent and substrate-adjacent portions 4x and 4y, respectively, with distinctly different doping concentrations N- and N. It can also be of benefit when the trenches 11 reach to the highly-doped substrate 60. Such situations are illustrated in FIGS. 3 and 4.

In the rectifiers 1c and 1d of FIGS. 3 and 4, the surface-adjacent portion 4x has a lower doping concentration N- than the doping concentration N of the substrate-adjacent portion 4y. The surface-adjacent portion 4x may have a low uniform doping concentration N- of, for example, $10^{15}$ or $10^{16}$ cm$^{-3}$. The substrate-adjacent portion 4y may also have a uniform doping concentration N, for example, of $10^{17}$ cm$^{-3}$. However, the substrate-adjacent portion 4y may have a graded doping concentration N that increases with distance to the substrate. Thus, the doping concentration N of the drift region portion 4y may increase from, for example, $1 \times 10^{16}$ cm$^{-3}$ adjacent to the portion 4x to, for example, $3 \times 10^{17}$ cm$^{-3}$ adjacent to the interface with the substrate 60. Similarly, the substrate-adjacent portion 4y of the drift region 4 of the devices of FIGS. 1 and 2 may have a graded or increased doping concentration N.

So as to reduce the capacitive coupling at the bottom of the trenches, the dielectric material 21y and 28 adjacent to the increased doping concentration (N of portion 4y and/or n+ of substrate 60) is preferably made thicker than the dielectric layer 21x adjacent to the lower doping concentration (N- of portion 4x). Such a situation is illustrated in FIGS. 3 and 4. The dielectric material 28 that lines at least the lower part of the perimeter trench 18 is of the same composition and thickness as the composition and increased thickness of the dielectric material 21y of the inner trenches 11. In the FIG. 3 device, the dielectric 28 is of the same thickness in both the surface-adjacent portion 4x and the substrate-adjacent portion 4y of the drift region. In the FIG. 4 device, the dielectric 28y is thicker in the substrate-adjacent portion 4y than the portion 28x in the surface-adjacent portion 4x.

In the devices of FIGS. 1 to 3, the perimeter field plate 38 is an extension of the main electrode 33. The thick dielectric layer 28 lines the perimeter trench 18 throughout its depth.

FIG. 4 illustrates a different situation in which the inner trenches 11 may run into the deeper and wider perimeter trench 18. The rectifier of FIG. 4 has its perimeter field plate 38 formed by an extension of the inner trench-electrode 31. Thus, the thinner and thicker dielectric portions 28x and 28y in the perimeter trench 18 of FIG. 4 may be formed in the same process steps (with the same composition and thickness) as the thinner and thicker dielectric portions 21x and 21y in the inner trenches 11.

The increased doping and dielectric thickness in the field-relief structures FIGS. 3 and 4 can be useful for fabricating Schottky rectifiers 1c and 1d having a low leakage current, a relatively high breakdown voltage and a low on-resistance.

By way of example, FIGS. 1 and 3 illustrate rectifiers 1a and 1c in which the drift region 4 extends to the surface 10a between the outermost inner trench 11 and the perimeter trench 18. An active rectifier area 43a is formed with the Schottky electrode 3 in this area between the outermost inner trench 11 and the perimeter trench 18. Instead of an active rectifier area 43a, it is also possible to provide other features in this area adjacent to the perimeter trench 18. Thus, for example, a breakdown shielding region 25 such as described in the U.S. application Ser. No. 09/167,298 and column 11 of U.S. Pat. No. 5,998,833 may be provided in at least a part of this perimeter area. FIGS. 2 and 4 illustrate the inclusion of such a region 25, which is of opposite conductivity type (p-type) to that of the rectifier drift region (n-type) which may be much more highly doped (p+). The region 25 is contacted by the electrode 3 which forms an ohmic contact therewith. The region 25 forms a p–n junction 45 with the area 4b of the drift region 4. The p–n junction 45 can function as an avalanche diode that turns on at the breakdown voltage. Both FIG. 2 and FIG. 4 illustrate this p–n junction 45 as terminating in the thick dielectric layer 28 or 28y of the perimeter trench 18.

The rectifiers of FIGS. 1 to 4 can be manufactured using known technologies. The device structures of FIGS. 1, 3 and 4 can be manufactured without requiring additional masking and processing steps to fabricate the perimeter field-plate structure 38,28,18.

Figure 5:
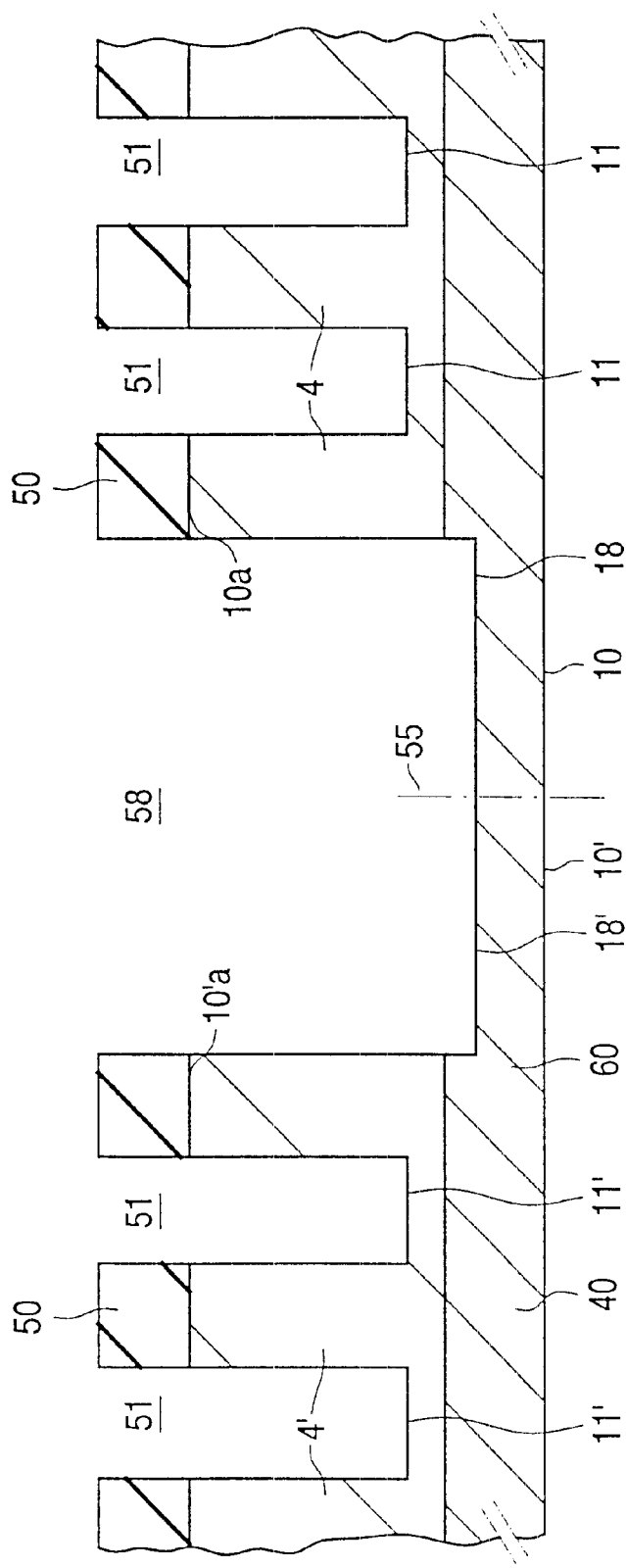
FIG. 5 is a cross-sectional view of part of a semiconductor wafer comprising two body parts of FIG. 2 or 3 or 4, at a stage in the manufacture of the rectifiers of FIG. 2 or FIG. 3 or FIG. 4 by a method in accordance with the invention.

Thus, FIG. 5 illustrates a manufacturing stage, in which the inner trenches 11 and a wider, deeper perimeter trench 18 are etched into the semiconductor body 10 using the same process steps and via respective windows 58 and 51 in a masking pattern 50 on the surface 10a of the body 10. The windows 51 for the inner trenches 11 are so narrow as to restrict the etch rate for these trenches 11 as compared with a wider window 58 for the perimeter trench 18. Thus, this process exploits to its advantage the well-known phenomenon of a so-called "loading effect", in which the etch rate is dependent on the amount of etchable surface exposed to the etchant.

In the devices of FIGS. 2 to 4, the perimeter trench 18 extends to the perimeter 15 of the body, and so the individual device bodies manufactured side-by-side in the wafer share a common double-width trench 18,18' around their individual perimeters. In this case, the separate bodies 10 are formed at a final stage in manufacture, by dividing the wafer along scribe-lanes 55 along the field-plate structure in the bottom of the common double-width trench 18,18'. Corresponding parts of the neighbouring device body in FIG. 5 are given the same reference signs as those of the body of FIGS. 1 to 4, but followed by an apostrophe.

Vertical discrete devices 1a, 1b, 1c and 1d have been described with reference to FIGS. 1 to 4, having their second main electrode 34 contacting a substrate 60 at the back surface 10b of the body 10. However, an integrated device is also possible in accordance with the invention. In this case, the highly conductive region 60 may be a doped buried layer between a device substrate and an epitaxial region 4 and may be contacted by electrode 34 at the front major surface 10a via a doped peripheral contact region which extends from the surface 10a to the depth of the buried layer.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new Claims may be formulated to any such and/or combinations of such features during the prosecution of the present Application or of any further Application derived therefrom.

What is claimed is:

1. A Schottky rectifier comprising a semiconductor body having a body portion of one conductivity type between first and second main electrodes, of which the first main electrode forms a Schottky barrier with the body portion at a plurality of rectifier areas of a first surface of the body portion, and a pattern of trenches extending into the body portion from the first surface, the pattern comprising inner trenches that bound each rectifier area and a perimeter trench that has an inside wall extending around the outer perimeter of the plurality of rectifier areas, the trenches accommodating a field-electrode that is connected to the first main electrode, the field-electrode being capacitively coupled to the body portion via dielectric material that lines the trenches so as to provide field-relief regions in the body portion, a depletion layer being formed in the body region from the Schottky barrier and from the field-relief regions in a blocking state of the rectifier, characterised in that the field-electrode in the perimeter trench is present on dielectric material on said inside wall of the perimeter trench and is capacitively coupled across said inside wall without acting on any outside wall, and in that the inner and perimeter trenches are sufficiently closely spaced and the intermediate areas of the body portion are sufficiently lowly doped that the depletion layer formed in the body portion in the blocking state of the rectifier depletes the whole of the intermediate areas of the body portion between the trenches at a voltage less than the breakdown voltage.

2. A rectifier as claimed in claim 1, further characterised in that the perimeter trench extends deeper in the body than the inner trenches.

3. A rectifier as claimed in claim 2, further characterised in that the body portion comprises a drift region present on a higher conductivity substrate of the same one conductivity type, and the perimeter trench extends through the thickness of the drift region to the substrate.

4. A rectifier as claimed in claim 1, further characterised in that the perimeter trench is wider than the inner trenches.

5. A rectifier as claimed in claim 4, further characterised in that the perimeter trench extends to the perimeter of the semiconductor body and so provides no outside wall.

6. A rectifier as claimed in claim 1, further characterised in that the dielectric material that lines at least a lower part of the perimeter trench is thicker than the dielectric material that lines at least an upper part of the inner trenches.

7. A rectifier as claimed in claim 1, further characterised in that the body portion comprises a drift region present on a higher conductivity substrate of the same one conductivity type, and the drift region has distinct surface-adjacent and substrate-adjacent portions which are of different doping concentrations, the surface-adjacent portion having a lower doping concentration than the substrate-adjacent portion.

8. A rectifier as claimed in claim 1, further characterised in that the body portion comprises a drift region present on a higher conductivity substrate of the same one conductivity type, and the substrate-adjacent portion of the drift region has a graded doping concentration that increases with distance to the substrate.

9. A rectifier as claimed in claim 7, further characterised in that the dielectric material that lines the inner trenches is of increased thickness in the substrate-adjacent portion of the drift region as compared with its thickness in the surface-adjacent portion.

10. A rectifier as claimed in claim 9, further characterised in that the dielectric material that lines at least a lower part of the perimeter trench is of the same composition and thickness as the composition and increased thickness of the dielectric material of the inner trenches in the substrate-adjacent portion of the drift region.

11. A rectifier as claimed in claim 1, further characterised in that the body portion of the one conductivity type extends to the surface between the outermost inner trench and the perimeter trench.

12. A rectifier as claimed in claim 1, further characterised in that a breakdown shielding region of the opposite conductivity type is present between the outermost inner trench and the perimeter trench and forms a p—n junction with the body portion of the one conductivity type.

13. A method of manufacturing a rectifier as claimed in claim 4, wherein the wider, deeper perimeter trench and the inner trenches are etched into the semiconductor body using the same process steps and via respective windows in a masking pattern on the surface of the body, and wherein the windows for the inner trenches are so narrow as to restrict the etch rate for the array trenches as compared with a wider window for the perimeter trench.

* * * * *